(12) United States Patent
Pogrebnyak et al.

(10) Patent No.: US 11,133,409 B2
(45) Date of Patent: Sep. 28, 2021

(54) BALLISTIC FIELD-EFFECT TRANSISTORS BASED ON BLOCH RESONANCE AND METHODS OF OPERATING A TRANSISTOR

(71) Applicant: The Research Foundation for The State University of New York, Amherst, NY (US)

(72) Inventors: Victor Pogrebnyak, Amherst, NY (US); Jonathan Bird, Buffalo, NY (US)

(73) Assignee: The Research Foundation for The State University of New York, Amherst, NY (US)

( * ) Notice: Subject to any disclaimer, the term of this patent is extended or adjusted under 35 U.S.C. 154(b) by 30 days.

(21) Appl. No.: 16/656,549

(22) Filed: Oct. 17, 2019

(65) Prior Publication Data

US 2020/0127130 A1    Apr. 23, 2020

Related U.S. Application Data

(60) Provisional application No. 62/747,106, filed on Oct. 17, 2018.

(51) Int. Cl.
*H01L 29/778* (2006.01)
*H01L 29/10* (2006.01)
*H03B 1/02* (2006.01)

(52) U.S. Cl.
CPC ...... *H01L 29/7786* (2013.01); *H01L 29/1029* (2013.01); *H03B 1/02* (2013.01)

(58) Field of Classification Search
CPC ............ H01L 29/7787; H01L 29/0657; H01L 29/0665; H01L 29/1029; H01L 29/1066;
(Continued)

(56) References Cited

U.S. PATENT DOCUMENTS 5,640,022 A * 6/1997 Inai ................... B82Y 10/00
257/14
5,701,017 A * 12/1997 Patel .................. B82Y 10/00
257/194

(Continued)

OTHER PUBLICATIONS

Chhowalla, M., et al., Two-dimensional semiconductors for transistors, Nature Reviews Materials, Aug. 17, 2016, vol. 1, pp. 1-18.

(Continued)

*Primary Examiner* — Shaun M Campbell
(74) *Attorney, Agent, or Firm* — Hodgson Russ LLP

(57) ABSTRACT

A semiconductor device includes a source, a drain, and a channel electrically connected to the source and the drain. The channel has a channel length from the drain to the source which is less than or equal to an electron mean free path of the channel material. A first gate has two arms, each extending between the drain and the source (i.e., at least a portion of the distance between the source and the drain). Each arm of the first gate is disposed proximate to a corresponding first and second edge of the channel. Each arm of the first gate has a periodic profile along an inner boundary, wherein the periodic profiles of each arm are offset from each other such that a distance between the arms is constant. A Bloch voltage applied to the first gate will reduce the effective channel with such that Bloch resonance conditions are met.

18 Claims, 15 Drawing Sheets

(58) Field of Classification Search
CPC ......... H01L 29/42316; H01L 29/66462; H01L 29/2003; H03B 1/02
See application file for complete search history.

(56) References Cited

U.S. PATENT DOCUMENTS

| | | | |
|---|---|---|---|
| 7,719,070 | B2 | 5/2010 | Hall et al. |
| 7,851,784 | B2 | 12/2010 | Kastalsky |
| 7,858,965 | B2 | 12/2010 | Lu et al. |
| 7,960,757 | B2 | 6/2011 | Jalil et al. |
| 8,803,340 | B2 * | 8/2014 | Moddel ................ H01L 31/08 257/798 |
| 9,197,215 | B1 | 11/2015 | Balandin et al. |
| 9,484,428 | B2 | 11/2016 | Jacob |
| 9,786,852 | B2 | 10/2017 | Franklin et al. |
| 9,812,642 | B2 | 11/2017 | Burenkov |
| 9,899,501 | B2 | 2/2018 | Pourtois et al. |
| 2007/0008778 | A1* | 1/2007 | Wang ................ G11C 16/3427 365/185.18 |
| 2008/0136454 | A1* | 6/2008 | Diduck ................ H03K 19/08 326/102 |
| 2012/0198591 | A1 | 8/2012 | Ohnesorge |
| 2016/0155839 | A1* | 6/2016 | Strachan ............. H01L 29/7881 257/29 |
| 2016/0190257 | A1* | 6/2016 | Tzeng ................ H01L 29/1606 250/208.2 |
| 2016/0196948 | A1 | 7/2016 | Kim et al. |
| 2017/0024503 | A1 | 1/2017 | Connelly |
| 2019/0018041 | A1* | 1/2019 | Ilani ...................... B82Y 10/00 |
| 2019/0312136 | A1* | 10/2019 | Bramanti ............ H01L 29/7787 |

OTHER PUBLICATIONS

Wang, J., et al., Ballistic Transport in High Electron Mobility Transistors, IEEE Transactions on Electron Devices, Jul. 2003, vol. 50, No. 7, pp. 1604-1609.

Shorubalko, I., et al., A Novel Frequency-Multiplication Device Based on Three-Terminal Ballistic Junction, IEEE Electron Device Letters, Jul. 2002, vol. 23, No. 7, pp. 377-379.

Hu, C.M., et al., Spin-polarized transport in a two-dimensional electron gas with interdigital-ferromagnetic contacts, Physical Review B, Mar. 13, 2001, vol. 63, No. 125333, pp. 1-4.

Rahman, A., et al., A Compact Scattering Model for the Nanoscale Double-Gate Mosfet, IEEE Transactions on Electron Devices, Mar. 2002, vol. 49, No. 3, pp. 481-489.

* cited by examiner

The first configuration: the gate voltage applied to A- fingers on the upper gate-arm The A-state of the transistor: voltage applied to A- fingers The second configuration: the gate voltage applied to B- fingers on the upper gate-arm The B-state of the transistor: voltage applied to B- fingers

BALLISTIC FIELD-EFFECT TRANSISTORS BASED ON BLOCH RESONANCE AND METHODS OF OPERATING A TRANSISTOR

CROSS-REFERENCE TO RELATED APPLICATIONS

This application claims priority to U.S. Provisional Application No. 62/747,106, filed on Oct. 17, 2018, the disclosure of which is incorporated herein by reference.

FIELD OF THE DISCLOSURE

The present disclosure relates to transistors, and more particularly to field-effect transistors.

BACKGROUND OF THE DISCLOSURE

On average, 8 trillion transistors are produced every second. In 2014 (50 years of Moore's law), semiconductor production facilities made some 250 billion billion (250× $10^{18}$) transistors. IEEE Spectrum magazine called this transistor production at "astronomical scales."

In 1958-1960, Dawon Kahng and Martin Atalla (Bell Labs) invented the metal-oxide semiconductor field-effect transistor (MOSFET), and in 1963, the invention issued as U.S. Pat. No. 3,102,230. A typical MOSFET structure is shown in FIG. 1A. However, MOSFETs have several major drawbacks which have slowed development in transistor technology:

1) As shown in FIG. 1A, a basic MOSFET structure includes two types of semiconductor—n-type and p-type—and their junctions (shown in FIG. 1A as a depletion region). When dimensions of transistors go to the submicron scale, the p-n junctions begin to operate as part of parasitic junction transistors because a potential applied to the gate affects the whole MOSFET structure. As a result, the bias potential drives the parasitic transistors and this phenomenon dramatically reduces MOSFET effectiveness.

2) Another weak feature of the basic structure is a thin dielectric layer (oxide), located between the gate and the channel. The presence of this thin oxide layer sets a lower limit to the transistor size and this constraint will end eventually Moore's law.

Advancements in MOSFET technology have reduced the dimensions of transistors and, as a result, has also reduced the thickness of oxide layers. When the thickness of an oxide layer reaches a value of a few de Broglie electron wavelengths (a fraction of a nanometer), electrons will escape the channel, tunneling through this very thin oxide to the positively charged gate that attracts the electrons. This will result in the failure of the transistor to function properly.

For this reason, the minimum oxide thickness sets the ultimate limit to the ability to scale down transistor and chip dimensions, and marks the end of Moore's law and the end of the era of MOSFETs based on the classical configuration.

A 2015 Report from the International Technology Roadmap for Semiconductors states "by 2020-25 device features will be reduced to a few nanometers and it will be practically impossible to reduce device dimensions any further . . . and seems to prelude to the unavoidable end of the integrated circuits era . . . ."

3) Another drawback of the basic MOSFET configuration that fundamentally prevents continued advancement is the principal of MOSFET operation itself. The heart of a MOSFET is the three-layer structure illustrated in FIG. 1A: (1) a channel, (2) a thin dielectric, and (3) a metal gate. The channel is a thin conducting layer (TCL). The mechanism of MOSFET operation is based on a significant variation of electron concentration in the channel upon the application of voltages to the gate and drain. The significant change in the concentration caused by the gate voltage results in the ON/OFF states in transistor operation. When the MOSFET is in an ON-state, electrons or any other charge carriers (electrons or holes) can move freely only in the xy-plane and are confined in the vertical z-direction. The thickness of a TCL is usually a fraction of a nanometer. In the case of the transistor of FIG. 1, current flows along the y-axis.

Some research groups have concentrated on developing different types of two-dimensional conducting layers. Modern semiconductor nanotechnology has provided several new a-few-atomic-layer thick two-dimensional conducting materials such as graphene and molybdenum disulfide ($MoS_2$). The best studied TCL is a two-dimensional electron gas (2DEG) grown at the interface between two similar semiconductors, such as, for example, GaAs and AlGaAs, which form a GaAs/AlGaAs heterostructure. A fast high electron mobility transistor (HEMT) based on this heterostructure was built and has been widely used in RF electronics. In 2015, a research group created a 4-inch wafer with a $MoS_2$ TCL and fabricated 8,100 $MoS_2$ FET devices on the wafer. However, the performance of these transistors was significantly lower (low currents) compared to MOSFET transistors or HEMTs.

Implementations of these new TCLs have allowed improvements in transistors by, for example, eliminating p-n junctions and reducing transistor size. However, so far, such improvements are mostly based on the traditional approach to the ON/OFF switching: a significant change in the charge carriers concentration in the channel upon the application of voltages to the gate and drain. There remains a long-felt need for new alternatives to the classical principle of operation of a field effect transistor.

BRIEF SUMMARY OF THE DISCLOSURE

The presently-disclosed transistor—a ballistic Bloch field-effect transistor ("BBFET")—is of a new design and based on a fundamentally new principle of operation. The BBFET is a multifunctional transistor that has several DC states and, in some embodiments, can also operate as an oscillator. All states are controlled by a negative gate potential or by varying the Fermi-level of a 2DEG.

DESCRIPTION OF THE DRAWINGS

For a fuller understanding of the nature and objects of the disclosure, reference should be made to the following detailed description taken in conjunction with the accompanying drawings, in which:

FIG. 19A shows how a ~2 GHz Bragg gap opens at ~7.6 GHz at $k_x$=q/2, in a configuration where Δx=a/2. This is reflected in the blue line of FIG. 19B which shows measured $S_{21}$ vs. frequency. In a configuration where Δx=0, a ~3.2 GHz Bloch gap opens at ~11.2 GHz and $k_x$=q/2. FIG. 19C shows transformation of dispersion due to Bloch resonance. The degenerate cutoff frequency ~11 GHz splits, opening a ~3.2 GHz Bloch gap (shaded region of the figure) at $k_x$=0.

DETAILED DESCRIPTION OF THE DISCLOSURE

Figure 1A:
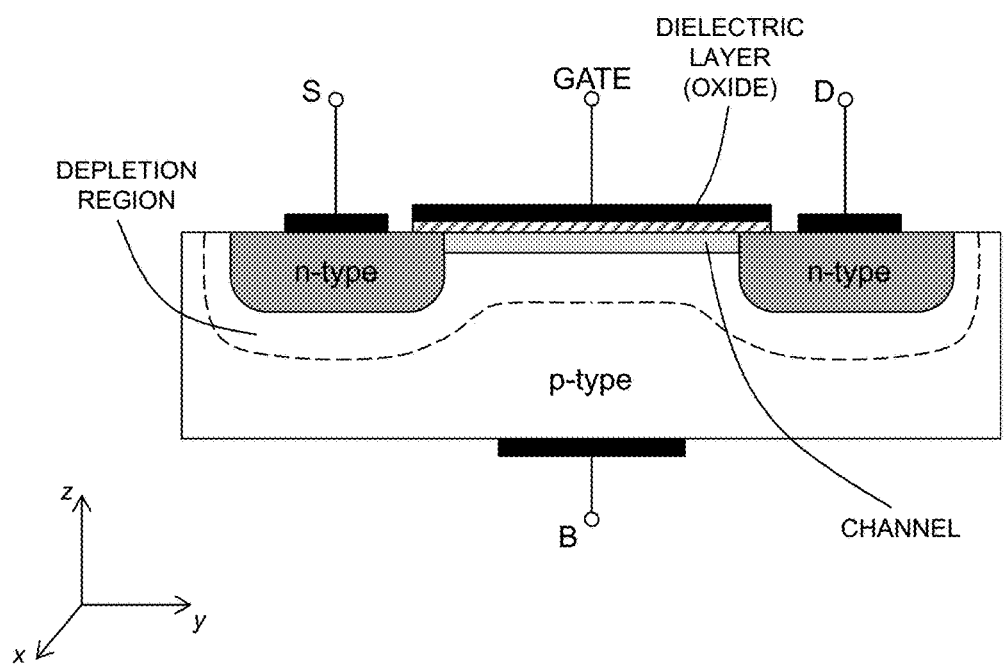
FIG. 1A is a side-elevation cross-section diagram of a typical MOSFET transistor.
Figure 1B:
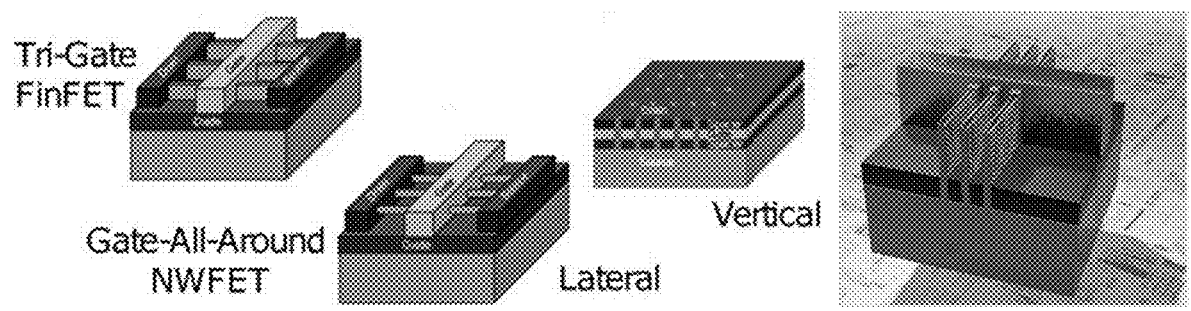
FIG. 1B shows recent developments in transistor technology, including the Intel® Tri-gate Fin-FET shown in the right panel.
Figure 2:
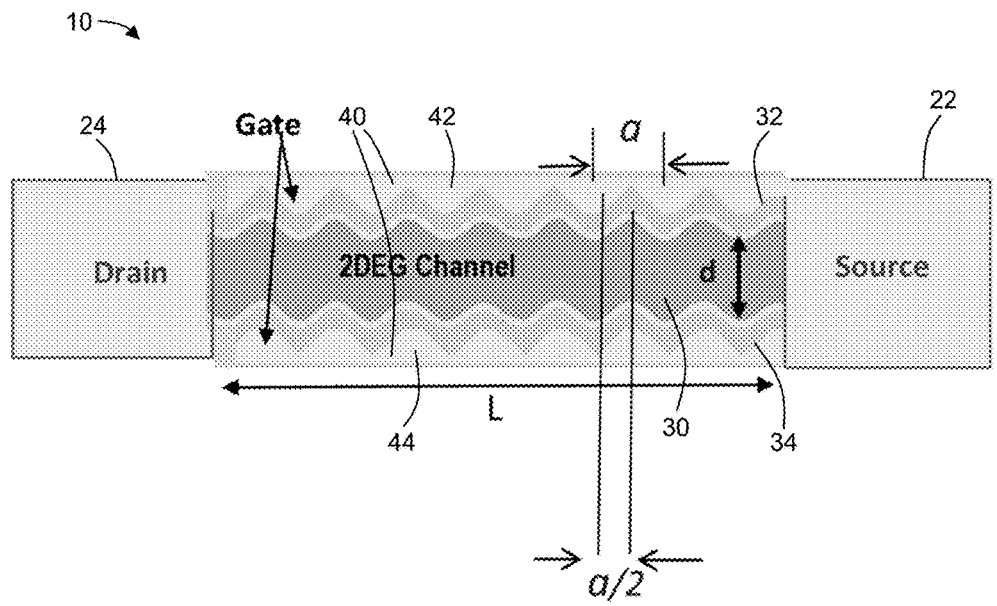
FIG. 2 is a top view diagram of a ballistic Bloch-Field Effect Transistor (BBFET) gate-channel configuration according to an embodiment of the present disclosure, wherein the transistor is shown in the volatile OFF state. The gate-arms are electrically connected and connected to negative potential on the source.

In a first aspect, the present disclosure may be embodied as a semiconductor device 10 (a lateral-gate ballistic Bloch field-effect transistor or "BBFET") having a source 22 and a drain 24 spaced apart from the source 22 (see, e.g., FIG. 2). The source 22 and the drain 24 may be fabricated using known Ohmic technology. In some embodiments, the structure may be disposed on a substrate 12. A channel 30 is electrically connected to the source 22 and the drain 24. The channel 30 may be a two-dimensional conducting layer (2DCL), such as, for example, a two-dimensional electron gas (2DEG). The channel 30 has a length (i.e., a channel length) measured from the source 22 to the drain 24. The channel length (L) is selected to be less than or equal to an electron mean free path $\ell$ of the material from which the channel is made (as further described below). In this way, the channel 30 has a ballistic electron transport-resulting in the BBFET as a ballistic transistor. Depending on channel 30 conditions (as further described below), electrical current may flow from a positive potential on the drain 24 to a negative potential on the source 22.

As stated above, the channel 30 of the BBFET may be made of a 2DCL material. Suitable 2DCLs include, for example, graphene, molybdenum disulfide $MoS_2$, and a high mobility 2-dimensional electron gas (2DEG), for example, a 2DEG at GaAs/AlGaAs or InAs/InGaAs heterostructure interfaces, and many others. In embodiments of the BBFET, it is advantageous for the selected 2DCL material to have a large electron mean free path $\ell$, for example, at a submicrometer scale, in order to have $\ell$ approximately equal to the channel length L. In a non-limiting example, a 2DEG in an InGaN heterostructure may be selected and provides room temperature ballistic transport and an electron mean free path $\ell$=75 nm. An electron concentration in such a 2DEG is n≈$10^{13}$ cm$^{-2}$. A suitable channel length for a BBFET made from such a 2DEG would be L≤75 nm (the length of the channel from the drain to source). A suitable width is, for example, W≈10 nm.

Figure 20:
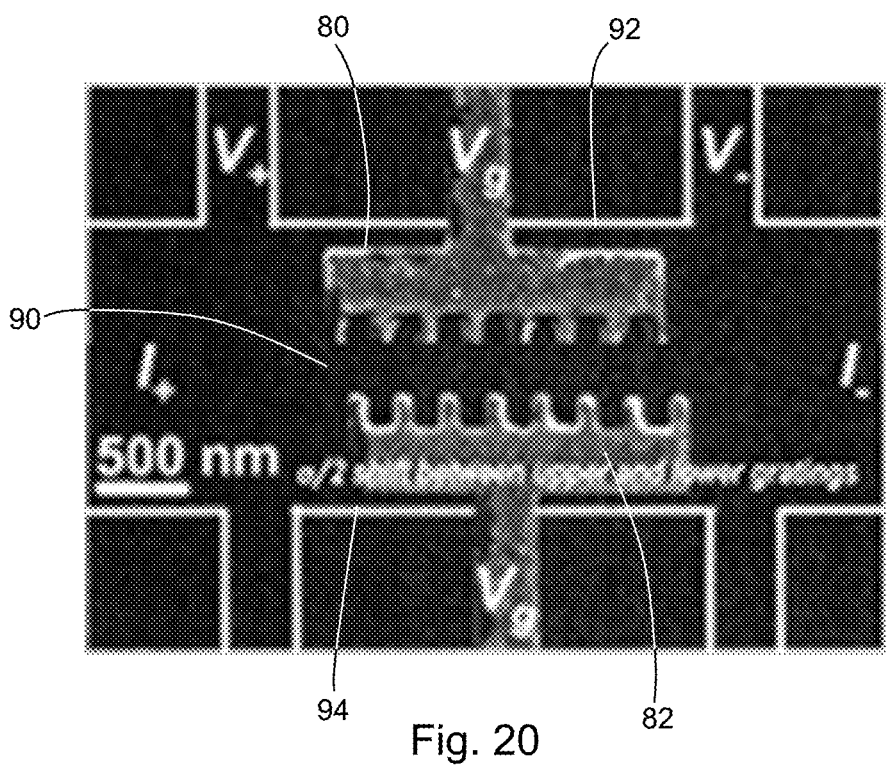
FIG. 20 shows micrograph mock-up of an exemplary experiment for validating a ballistic Bloch-FET at low temperature (the micrograph is modified from a micrograph of a Bragg experiment). Parameters of the micrograph include channel width d=700 nm and length L~2400 nm; "finger" length=70 nm~10% of d; period of the grating a=175 nm; number of "fingers"=13; m*=0.067 $m_0$, $\ell_c$=2500 nm.

The device 10 further includes a first gate 40 having two arms 42, 44. The arms 42, 44 may be electrically connected to each other. Each arm extends between the source 22 and the drain 24. By extending between the source and the drain, the arms may or may not extend the entire distance between the source and the drain. The arms 42, 44 are arranged to be proximate to a first edge 32 and a second edge 34 of the channel 30, respectively. In an exemplary embodiment, wherein the channel is a 2DEG, the arms of the first gate may be disposed on the channel, each arm proximate to (i.e., adjacent) a corresponding one of the first or second edges of the channel. For example, FIG. 20 depicts a micrograph showing arms 80,82 of a first gate deposited on top of the channel 90, and each arm proximate to a corresponding one of the first edge 92 or the second edge 94. In other embodiments, the first gate may be coplanar with the channel. The first gate 40 may be made from, for example, aluminum, gold, and the like. In some embodiments, the arrangement is called a "lateral gate" because the first gate 40 is located at the edges of the channel 30 and affects current flow through the channel (e.g., the portion of the channel between the arms). This is in contrast to the traditional FET gate which is placed on the top of the channel and affects the current flow primarily in the channel region under the gate.

Figure 8:
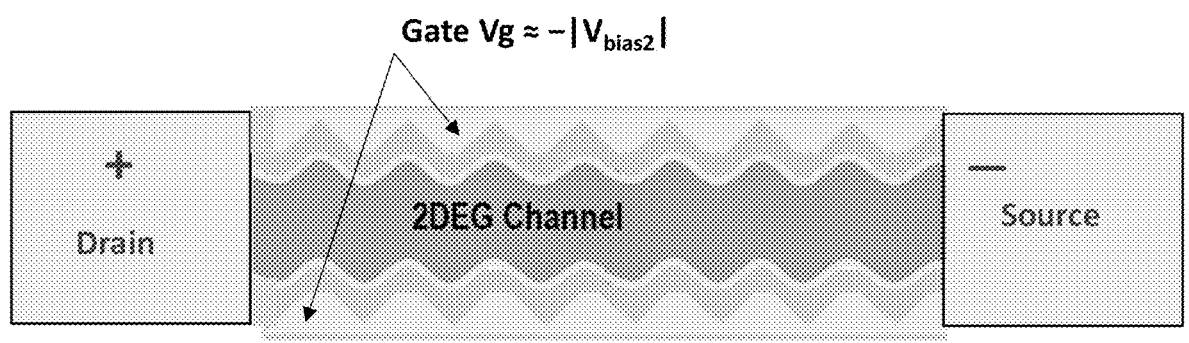
FIG. 8 is a top view of the device of FIG. 5 while in the volatile OFF state, showing that a negative gate potential forms a periodic shape of the channel that generates an energy band gap at the Fermi level.

Each arm 42, 44 of the first gate 40 has a periodic profile along the corresponding edge 32, 34 of the channel 30. In other words, each arm has a periodic profile along an inner boundary of the arm (an edge of the arm which faces the opposing arm of the gate). For example, in some embodiments, the arms 42, 44 have a sawtooth (e.g., triangular), rectangular, or sinusoidal profile. The profile of a first arm 42 is offset from the profile of a second arm 44 such that a distance between the arms is constant. For example, the profiles may have a shape with a period of a, and the offset of the profiles may then be a/2 (see, e.g., FIGS. 2-3). In a non-limiting example to illustrate the principle of operation, when a negative voltage is applied to the first gate 40, an electric field creates a depletion region around each arm of the first gate, pushing pushes electrons away from the arms including the tips of the sawtooth profile. As a result, an initially rectangular conducting area of the channel 30, depicted in FIG. 3, pinches and takes a periodical lateral profile such as that illustrated in FIG. 8. The channel lateral periodic profile would be similar to the shape of the profiles of the arms of the first gate. An effective width d of the channel 30 (sometimes referred to herein as "effective channel width") decreases as the gate voltage $V_g$ increases. The first gate 40 is configured to be connected to a negative potential source such that the first gate 40 repels electrons from the edges 32, 34 of the channel 30. At a gate voltage $V_g=V_{Bloch}$, d reaches a value of $d_B$ (also referred to herein as $d_{Bloch}$) that satisfies Bloch resonance conditions $$d_{Bloch} = \frac{a}{2}\sqrt{p^2 - n^2}$$

Figure 7A:
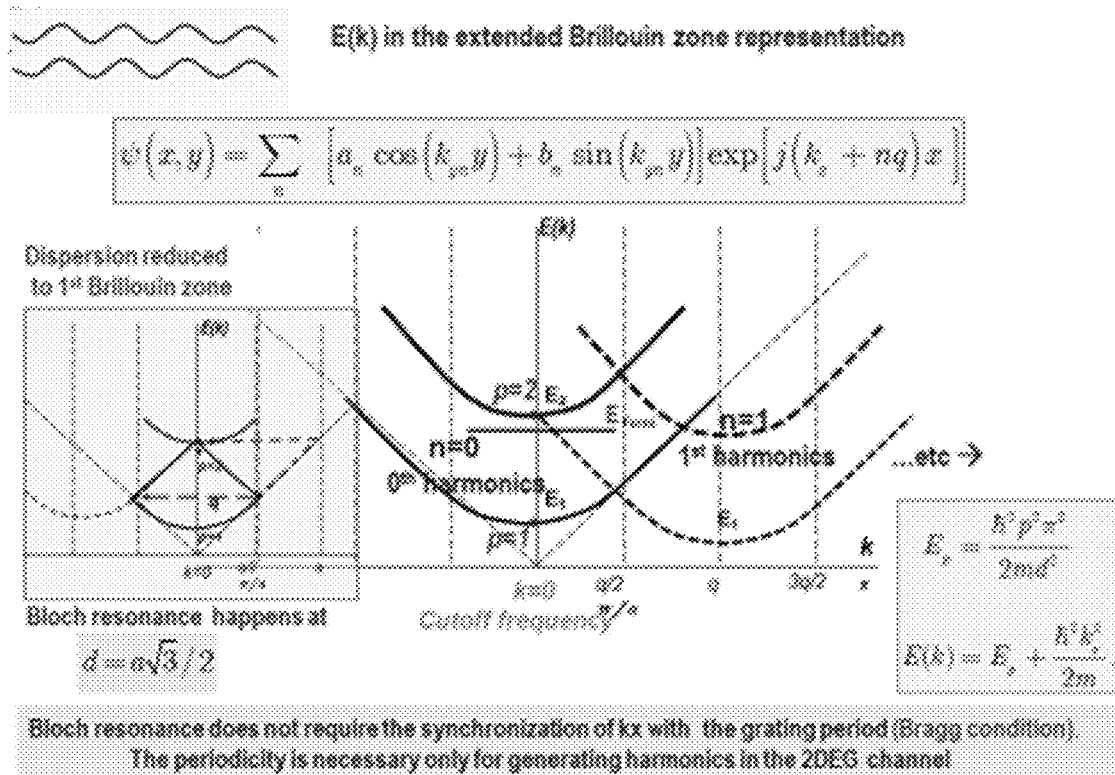
FIG. 7A shows a 2DEG energy band diagram in the extended Brillouin zone of a second state (OFF state) where $V_g \approx -|V|_{bias}$.
Figure 7B:
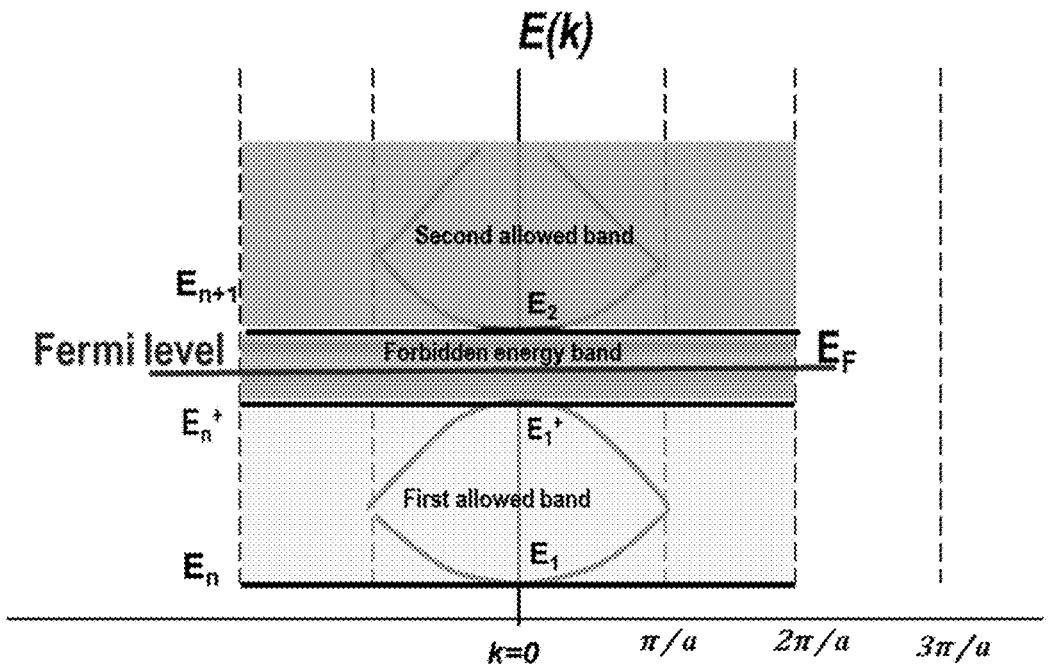
FIG. 7B shows a 2DEG energy band diagram folded to the 1st zone corresponding to Bloch resonance and the OFF state of the BBFET second state (OFF state) where $V_g \approx -|V|_{bias}$.

(for sinusoidal-shaped boundary profiles), where p and n are quantum numbers of energy states shown in FIG. 7A (as shown in FIG. 7A the extended Brillouin zone), along with the formula for energy levels in the FIG. 7A insert. The resonance happens between states with different parity, for example, if p is even the n is odd. A selection of two resonant states should also satisfy the condition that the $E_p(k)$ and $E_n(k)$ intersection point should be at the Fermi level of 2DEG as it shown in FIG. 7A for states p=2 and n=1 ($1^{st}$ harmonic). For these two states, $d_B = a\sqrt{3}/2$ (for sinusoidal boundary profiles) and the generated Bloch gap in the energy spectrum is shown in FIG. 7B. The gap coincides with the Fermi level in this example. In this case, the current flowing through the channel 30 drops to zero—the OFF states of the transistor. If the gate voltage is reduced to zero, the periodic channel restores its original shape, providing maximum current $I_{max}$—an ON state.

Figure 3:
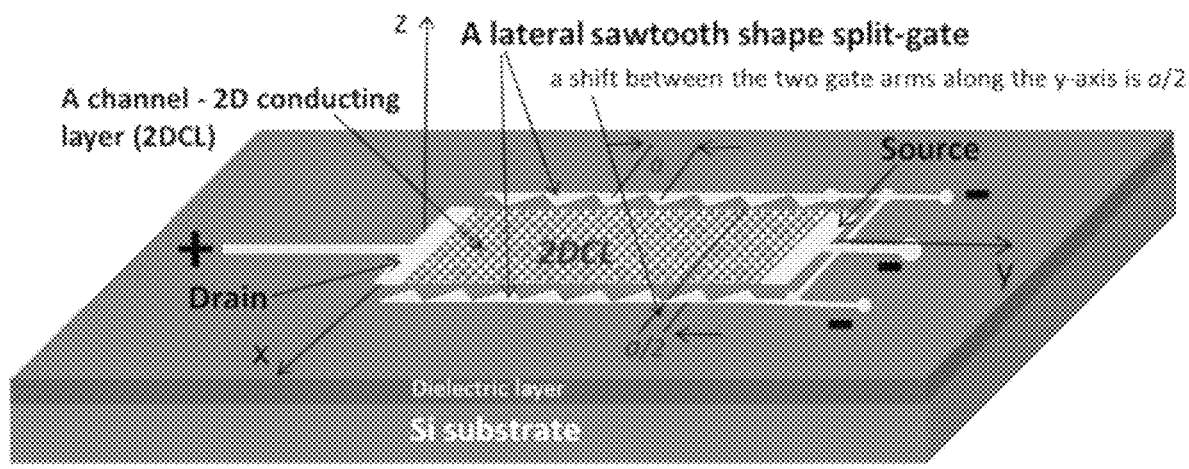
FIG. 3 is a perspective view of a BBFET in the non-volatile ON state according to another embodiment of the present disclosure.
Figure 5:
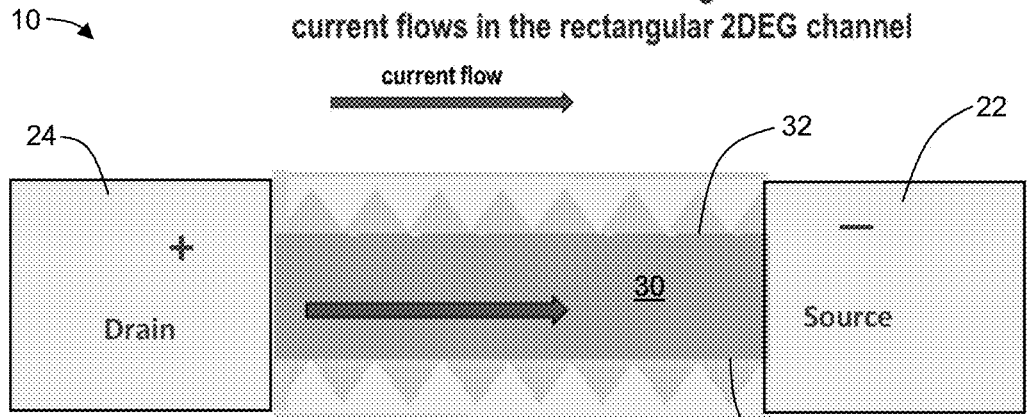
FIG. 5 is a top view diagram of a BBFET according to another embodiment of the present disclosure (if there is no voltage on the gate, then current flows in the channel)

In some embodiments (for example, as depicted in FIGS. 5 and 3), the first edge 32 and the second edge 34 of the channel 30 are straight and parallel to one another. In such a configuration, the non-volatile (i.e., $V_g=0$) state of the device 10 is "ON"—electrical current can flow from the drain 24 to the source 22, and a bias voltage of $V_{Bloch}$ will turn OFF the device 10. It should be noted that the edges need not be straight and parallel, only that the channel is configured to allow current flow when no bias voltages is applied at the first gate.

Figure 21:
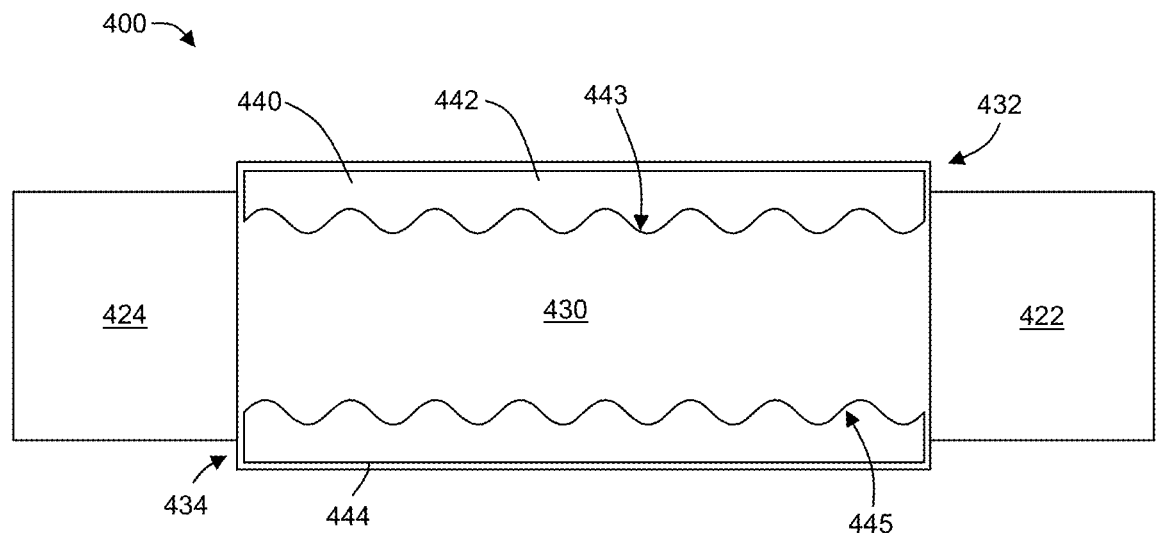
FIG. 21 is a top view diagram of a transistor according to another embodiment of the present disclosure where the first gate has a sinusoidal periodic profile.

FIG. 21 depicts a transistor 400 according to another embodiment of the present disclosure. The transistor 400 has a source 422 and a drain 424 spaced apart from the source 422. A channel 430 is electrically connected to the source 422 and the drain 424. The transistor 400 includes a first gate 440 having two arms 442, 444 proximate to the first edge 432 and the second edge 434 of the channel 430. The first gate 440 depicted in FIG. 21 has arms with sinusoidal profiles (each arm 442, 444 has a sinusoidal periodic profile along an inner boundary 443, 445 of the arm). The profile of a first arm 442 is offset from the profile of a second arm 444 such that a distance between the arms is constant.

Figure 22:
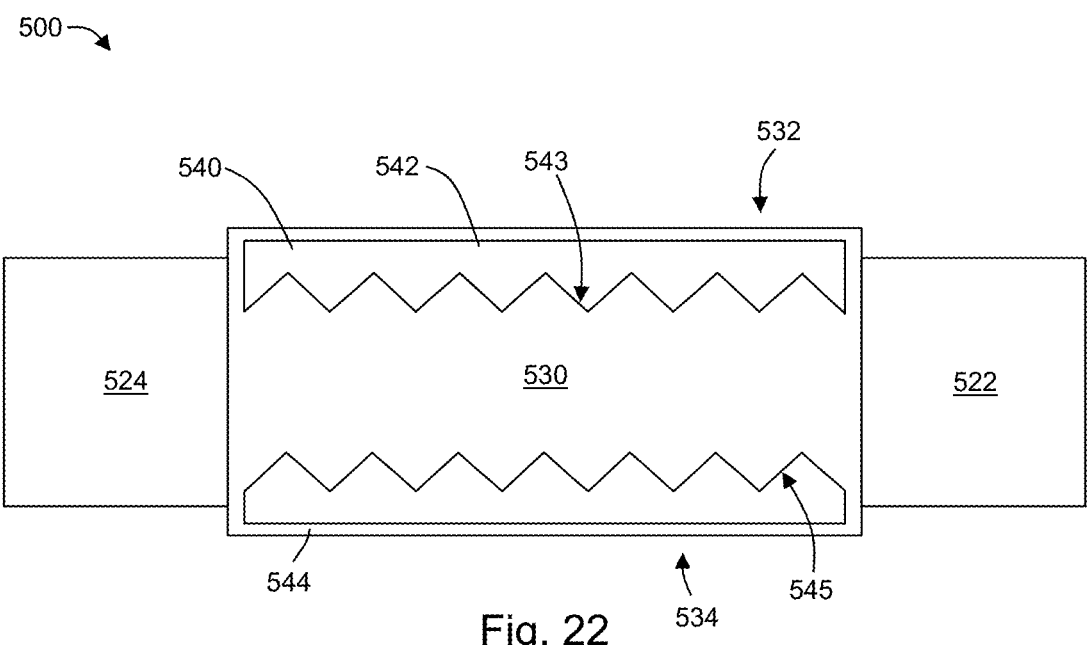
FIG. 22 is a top view diagram of a transistor according to another embodiment of the present disclosure where the first gate has a triangular periodic profile.

FIG. 22 depicts a transistor 500 according to another embodiment of the present disclosure. The transistor 500 has a source 522 and a drain 524 spaced apart from the source 522. A channel 530 is electrically connected to the source 522 and the drain 524. The transistor 500 includes a first gate 540 having two arms 542, 544 proximate to the first edge 532 and the second edge 534 of the channel 530. The first gate 540 depicted in FIG. 22 has arms with triangular (sawtooth) profiles (each arm 542, 544 has a triangular periodic profile along an inner boundary 543, 545 of the arm). The profile of a first arm 542 is offset from the profile of a second arm 544 such that a distance between the arms is constant.

In other embodiments, such as the device 100 depicted in FIG. 2C, the first edge 132 and the second edge 134 each have a periodic profile configured such that the channel 130 generates Bloch resonance when no bias voltage is applied to the first gate. For example, the periodic profiles of the first and second edges may correspond to the periodic profiles of a corresponding one of the arms of the first gate. For example, the edges 132, 134 may have sawtooth profiles that interdigitate with sawtooth profiles of the arms 142, 144. The periodic profile of the 2DCL channel generates a gap in the energy spectrum without applying a voltage to the first gate. In this configuration, the non-volatile (i.e., $V_g=0$) state of the device is "OFF" and a bias voltage applied to the first gate will turn ON the device.

Figure 13:
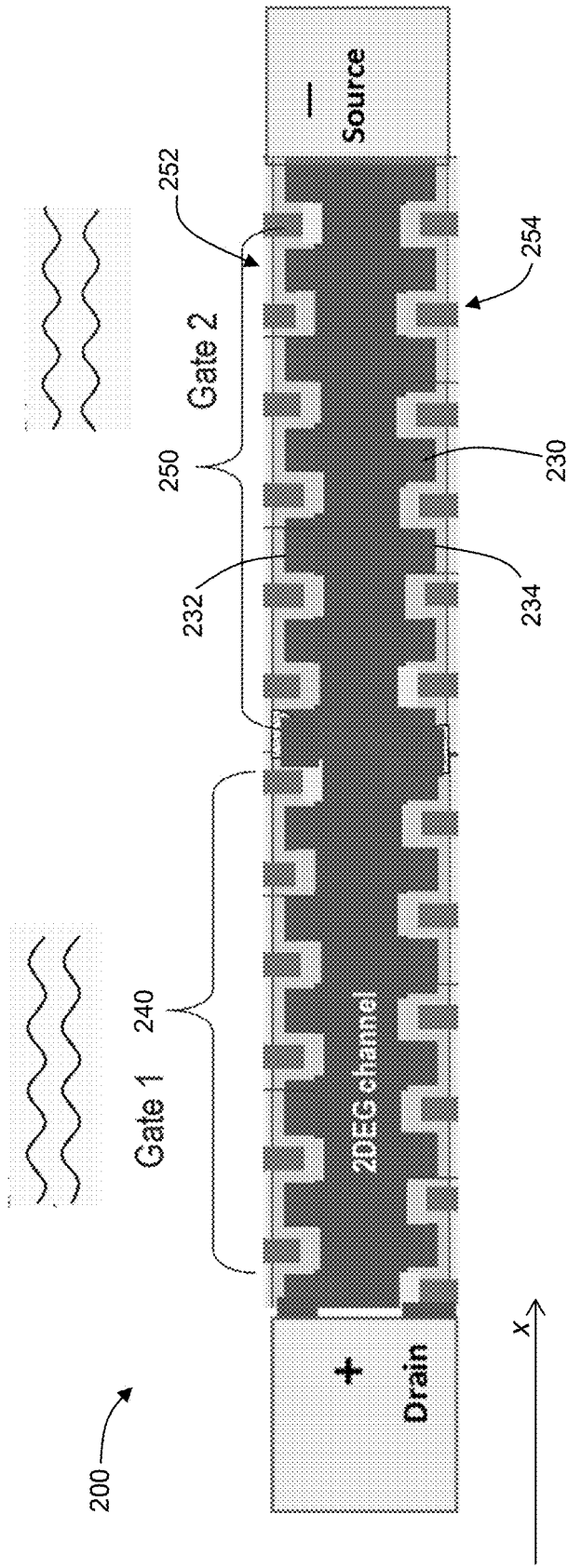
FIG. 13 shows a ballistic Bloch-FET according to another embodiment of the present disclosure with two sets of split-gates. The BBFET has two sets of gates having periodicity phase shifts Δx=0 for gate 1 and Δx=a/2 for gate 2.

In some embodiments, a device 200 further includes a second gate 250 in series with the first gate 240 along the length of the channel 230 (see, e.g., FIG. 13). The second gate 250 has two arms 252, 254 disposed adjacent to a first 232 and second edge 234 of the channel 230, respectively. Each arm 252, 254 of the second gate 250 has a periodic profile adjacent to the corresponding edge 232, 234 of the channel 230. The periodic profiles of each arm of the second gate 250 are different from the periodic profiles of the arms of the first gate 240. For example, in some embodiments, the periodic profiles of the arms of the second gate 250 are not offset from each other and the distance between the arms of the second gate 250 varies over the relevant length of the channel 230. Such a transistor has three basic configurations: (1) a gate voltage may be applied to the first gate 240, Δx=0 (note the direction of the x axis depicted in FIG. 13); (2) a gate voltage may be applied to the second gate 250, Δx=a/2; or (3) a gate voltage may be applied to both gates. Such a configuration allows expanded functionality by creating two different field-effect electronic energy bandgaps along the 2DEG channel (field-effect energy band heterostructure in 2DEG with a uniform chemical composition).

Figure 16:
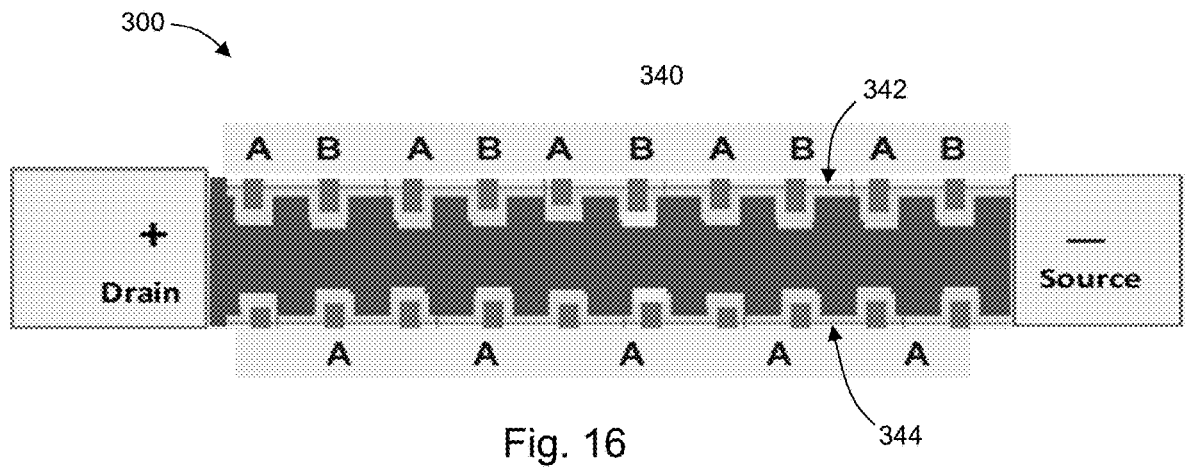
FIG. 16 shows the ballistic Bloch-FET according to another embodiment of the present disclosure with an interdigitated split-gate.
Figure 17A:
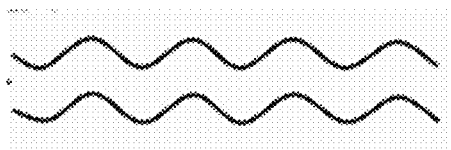
FIG. 17A shows the A-configuration of the transistor of FIG. 16, wherein there is an offset in the split gate (voltage applied to A-"fingers")
Figure 17B:
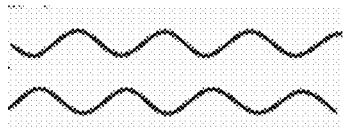
FIG. 17B shows the B-configuration of the transistor of FIG. 16, wherein there is no offset in the split gate (voltage applied to B-"fingers")

In some embodiments, such as the device 300 depicted in FIG. 16, the arms 342, 344 of the first gate 340 include a second periodic profile interdigitated with the first periodic profile. In such embodiments, the first gate 340 may be configured to selectively apply a bias voltage to the first periodic profile and/or the second periodic profile. In an exemplary embodiment, the profile is formed by protrusions ("fingers") which are spaced at a distance of a/2 (half period of the 2DCL channel lateral periodicity). Switching between the two profile configurations can be realized by applying a voltage to the A or B protrusions only on the first arm 342 of the split-gate 340. In this way, applying a voltage to the A protrusions (top and bottom) will create the configuration shown in FIG. 17A, and applying a voltage to the B protrusions (on one of the arms) will create the configuration of FIG. 17B.

Quantitative Description of BBFET Operation in Terms of Physics and Practical Parameters of the 2D Conducting Layer.

When the periodic potential configuration satisfies the condition of Bloch resonance, and Fermi energy coincides with a position of the Bloch gap in the electron energy spectrum, the electron transport through the channel would be blocked—corresponding to an OFF state of the BBFET. Additional detail regarding Bloch resonance and Bloch gaps is found in V. A. Pogrebnyak and E. P. Furlani, Tunable Bloch Wave Resonances and Bloch Gaps in Uniform Materials with Reconfigurable Boundary Profiles, Phys. Rev. Lett. 116, 206802 (2016), which is incorporated herein by this reference. Reducing the gate potential would return the transistor to an ON state. A position of the gap as well as the Fermi level can be adjusted by varying a potential on the gate, thus changing the effective width d of the channel. A distance a between two adjacent teeth on a sawtooth-shape gate should satisfy Bloch resonance conditions $$d_{Bloch} = \frac{a}{2}\sqrt{p^2 - n^2}$$

where p and n are quantum numbers of energy states shown in FIG. 7A (as shown in FIG. 7A the extended Brillouin zone), along with the formula for energy levels in the FIG. 7A insert. The resonance happens between states with different parity, for example, if p even the n is odd. A selection of two resonant states should also satisfy the condition that the $E_p(k)$ and $E_n(k)$ intersection point should be at the Fermi level of 2DEG as it shown in FIG. 7A for states p=2 and n=1 ($1^{st}$ harmonic). For these two states $d_B=a\sqrt{3}/2$ (for sinusoidal boundary profiles) and the generated Bloch gap in the energy spectrum is shown in FIG. 7B. The gap coincides with the Fermi level in this example. A length L of the channel may be at least seven to ten times greater than a that is suitable for the chosen 2DEG with $\ell$=75 nm. The ON/OFF ratio increases as L/a increases. For example, in a 10-tooth gate this ratio could reach up to $10^9$ as the simulation shows.

Figure 4:
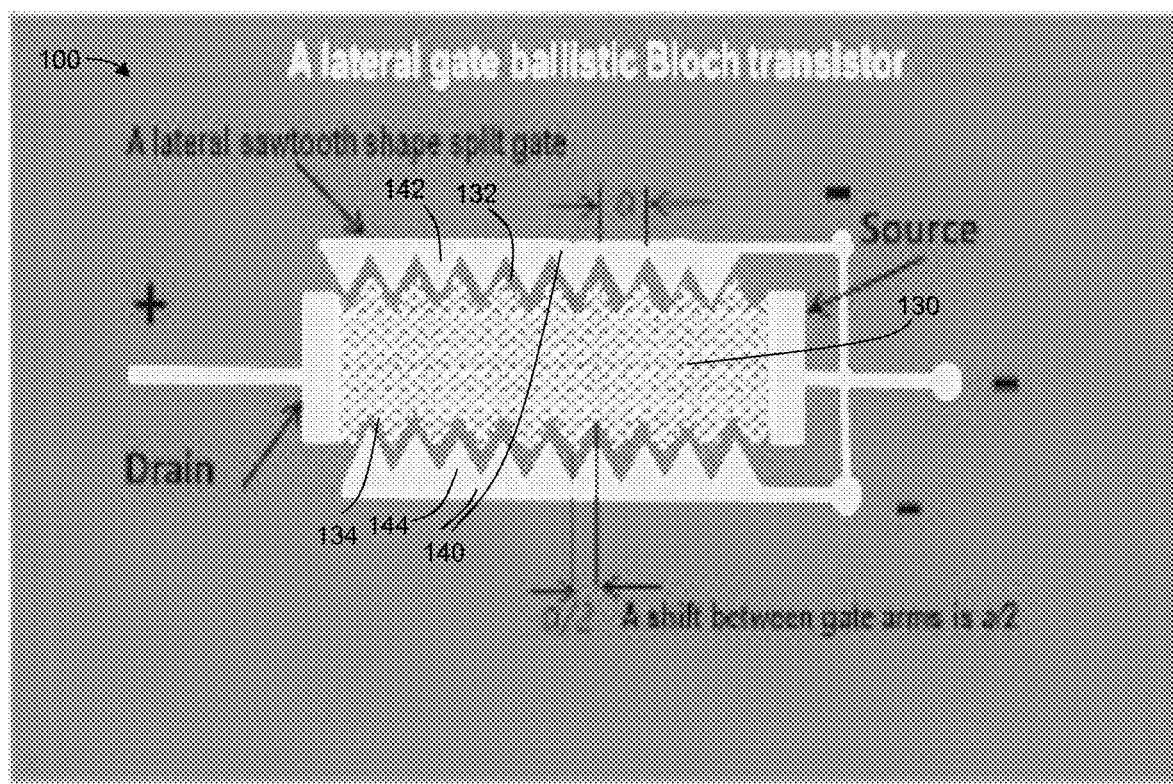
FIG. 4 is a top view diagram of a BBFET according to another embodiment, wherein the device is shown in the non-volatile OFF state.

When a voltage is applied to the gate, the effective width d of the channel reduces (FIG. 4) and the electron energy levels in the quantum channel would be moving up in the electron energy spectrum. When the energy gap generated by the periodic profile crosses the Fermi level ($E_F$=350 meV), the BBFET would be in an OFF state. For a gate voltage, that reduces the effective width to 7-10 nm, the energy band gap ΔE generated by the periodic profile would be ~100 meV—that greater than the room temperature energy spreading ~75 meV—and the transistor would operate reliably at room temperature.

The above-described BBFET operation refers to volatile OFF-state of the transistor—i.e., when a voltage is required to maintain an OFF state. The configuration of the BBFET can be easily modified to have a non-volatile OFF-state, potentially providing energy savings in some applications. In this case, the 2DEG may be patterned initially to have a periodic shape corresponding to the periodic profile of the gate arms with parameters d and a satisfying the conditions for Bloch resonance. In this case, at $V_g$=0, the transistor is in an OFF state. Applying a small voltage to the gate would break the conditions for Bloch resonance, and the transistor would be at an ON state. In many electronics applications, the non-volatile OFF state operation is preferable and common.

It is noted that modern semiconductor technology is developing very fast, and a new type of 2DCL is reported in the literature regularly. The 2DEG in InGaN heterostructure discussed above is only one example of a 2DCL suitable for the BBFET. Other suitable materials (such as graphene, etc.) will be apparent in light of the present disclosure.

Exemplary Modes of Operation

The $1^{st}$ State—ON

A first state, the non-volatile ON state, is as described above where $V_g$=0 and current is able to flow in the rectangular 2DEG channel (see, e.g., FIGS. 3A-3B).

The $2^{nd}$ State—OFF

A second state is the OFF state, where $V_g \approx -V_{bias}$, and the negative gate potential forms a periodic shape of the channel, thereby generating the energy bandgap as described above (see, e.g., FIGS. 4A-4B).

The $3^{rd}$ State—ON

A third state may be an ON state when the Fermi level of the 2DEG $E_F$ coincides with a Dirac point at the energy diagram (in the energy diagram, a tip of E(k) at k=π/a) (see, e.g., FIGS. 5A and 5B). In this state, the transistor is very sensitive to any small variations of voltages applied to its terminals. At this point on the diagram, the effective mass of an electron approaches zero.

The $4^{th}$ State—ON

Figure 9:
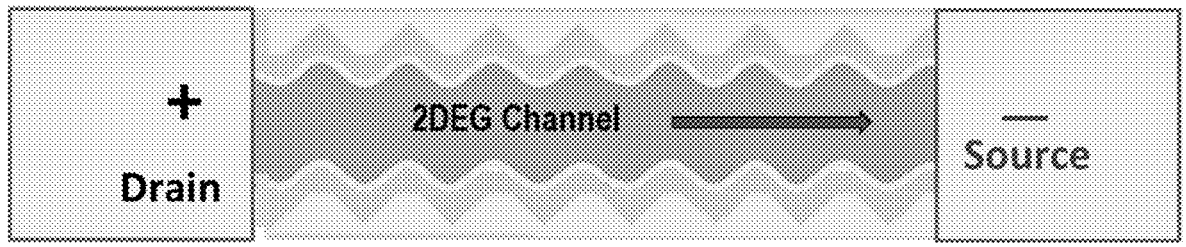
FIGS. 9 and 10 show a third state—the ON state when the Fermi level of 2DEG $E_F$ coincides with Dirac point on the 2DEG energy diagram. The Fermi level (red line) coincides with Dirac point (the tip of E(k) at k=π/a)
Figure 10:
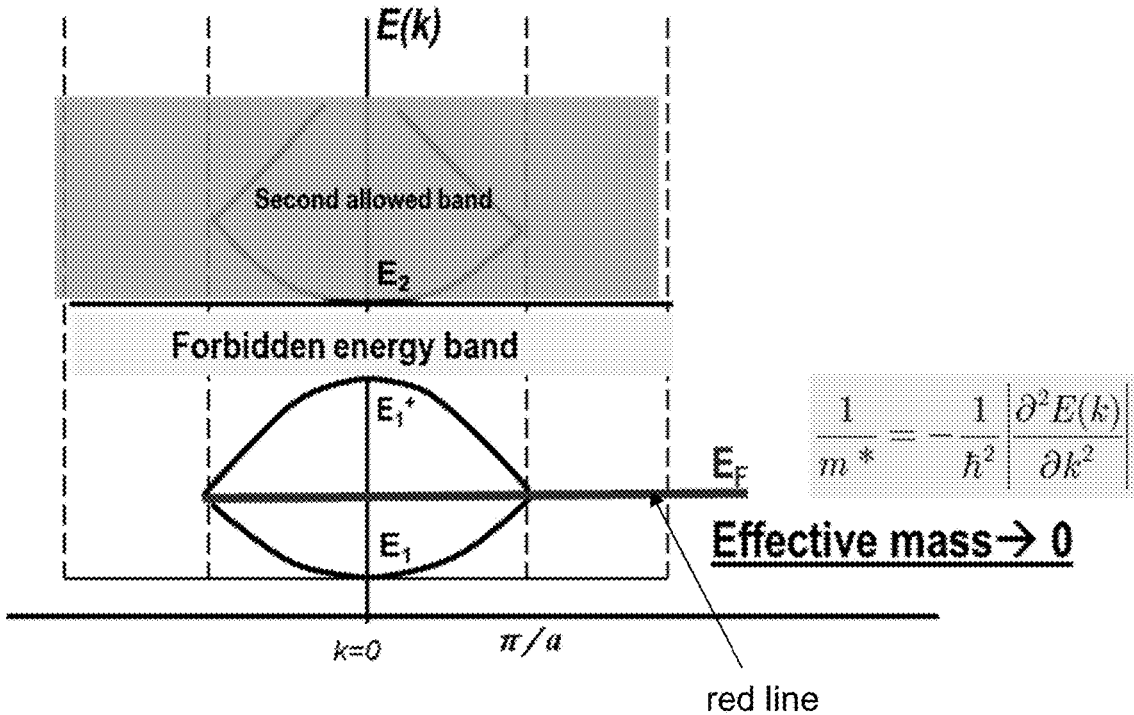
Figure 11:
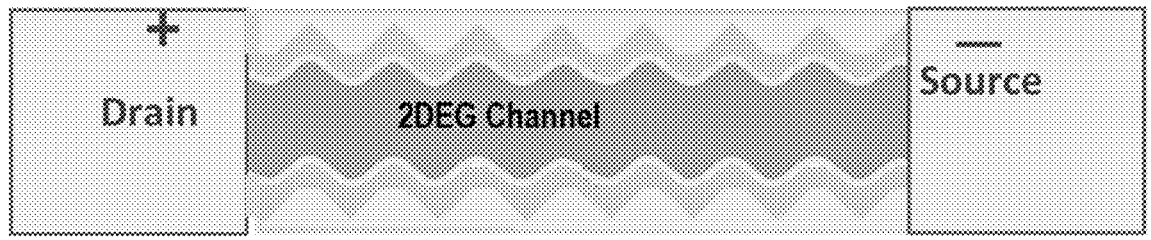
FIGS. 11 and 12 show a fourth state—two ON states in vicinity of a Dirac point when the Fermi level varies with $\pm\Delta E_F$ In the vicinity of a Dirac point, the electron effective mass approaches zero. A velocity of electrons in state 2 is positive, while in state 1 it has the opposite negative direction creating an opportunity to use the Bloch-FET as a device with negative differential conductivity—an oscillator.
Figure 12:
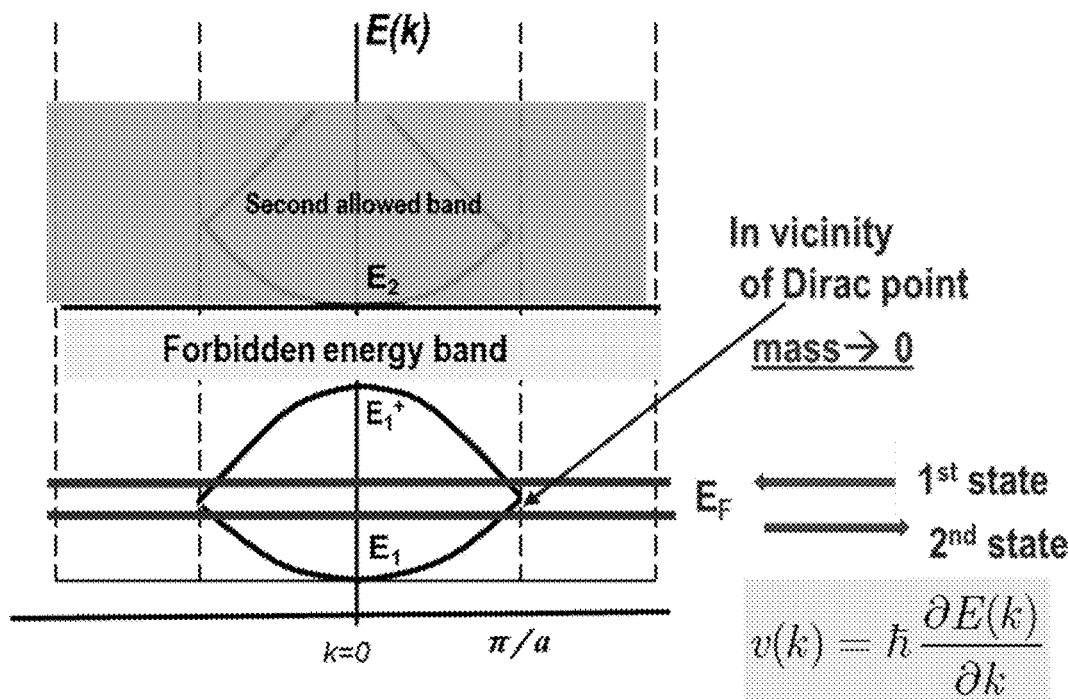

A fourth state may be two ON states in the vicinity of a Dirac point, where the Fermi level varies with $\pm \Delta E_F$ (see, e.g., FIGS. 6A and 6B). Near a Dirac point, the electron effective mass approaches zero. A velocity of electrons in a "state 2" (see FIG. 12) is positive, while in "state 1" it has the opposite negative direction. In this way, a BBFET may be used as a device with negative differential conductivity and potentially as an oscillator, as further described below with respect to FIGS. 9A and 9B.

A BBFET as a DC-to-AC Voltage Convertor—a BBFET Oscillator

The bandgap engineering in the BBFET opens doors to designing a device that directly converts DC voltage into AC voltage due to the achievements in synthesis of new materials with excellent ballistic transport.

Figure 18A:
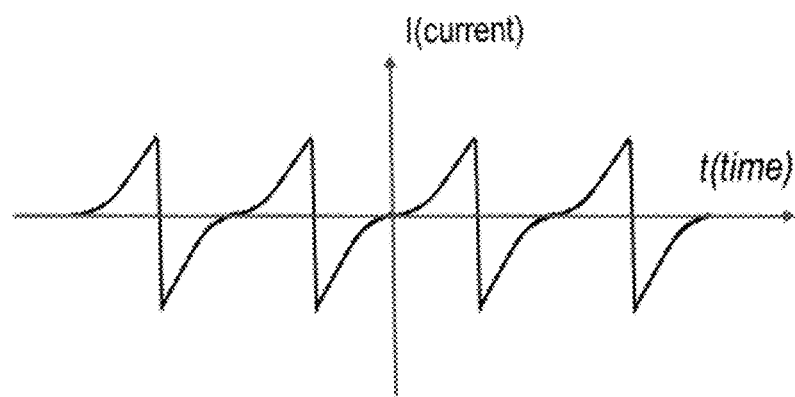
FIG. 18A shows the A-state of a Bloch-FET oscillator (see FIGS. 17A and 14) producing triangular-waveform current oscillations.
Figure 18B:
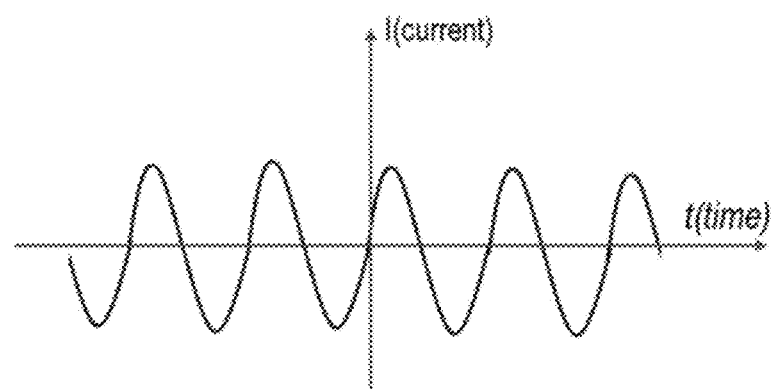
FIG. 18B shows the B-state of a Bloch-FET oscillator (see FIGS. 17B and 15) producing sinusoidal waveform current oscillations.

The 2DEG channel with periodic boundary profile in the BBFET has a fundamental property—the physical parameters of the BBFET (including energy and velocity v) depend periodically on the wave vector k. When a DC electric field is applied to the transistor, an electron momentum ℏk and energy E(k) increase. The variation of the energy and velocity with time happen in accordance with the energy band diagram E(k) that is a periodic function. To produce oscillations, the ballistic electrons should traverse in the k-space through the first Brillouin zone from one boundary to another. Electrons bounce between the two boundaries in the k-space and correspondingly between the drain and source in a transistor. The electron velocity, as the derivative of E(k), would produce oscillations of different waveforms depending on shape of E(k) that is controlled by the gate voltage. For example, the interdigitated BBFET oscillator (FIGS. 17A and 17B) would produce two waveforms of current oscillations as shown in FIGS. 18A and 18B. The oscillations start at the threshold voltage: $V_{DS}=V_{DS/th}$. At a voltage below the $V_{Ds/th}$, the device operates as the ON-OFF Block-FET, but at $V>V_{DS/th}$, it acts as an oscillator. At the $V_{DS/th}$, an electron, |e|, gets enough energy to move in E(k) space (see, e.g., FIGS. 14 and 15) from the minimum energy E(k=0) to the maximum energy E(k=π/a) that would correspond to oscillations. The criterion for the $V_{DS/th}$ can be written as:

$$\Delta E(\text{energy}) = |e| \times V_{\underset{th}{DC}} = [E(k=0) - E(k=\pi/a)] \equiv \Delta E_{th} \quad (1)$$

Figure 6:
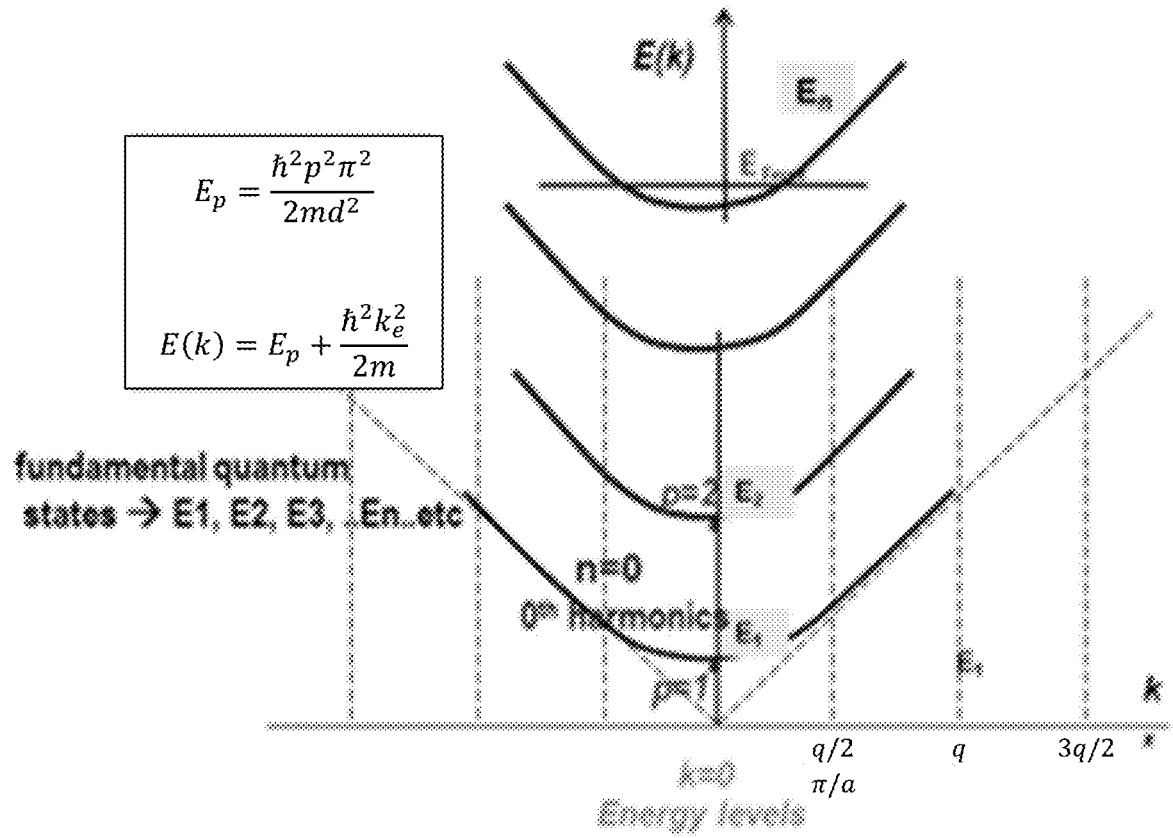
FIG. 6 is an energy band diagram of a 2DEG and showing Fermi level $E_F$ of 2DEG (k is the wave vector magnitude, m is mass, and q is periodicity in k-space)
Figure 14:
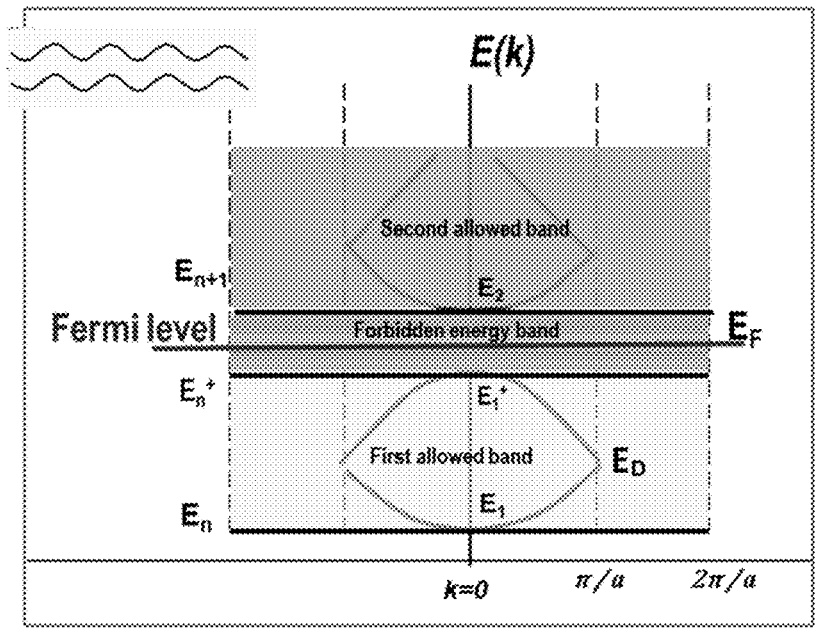
FIG. 14 shows the energy band diagram for Δx=0.
Figure 15:
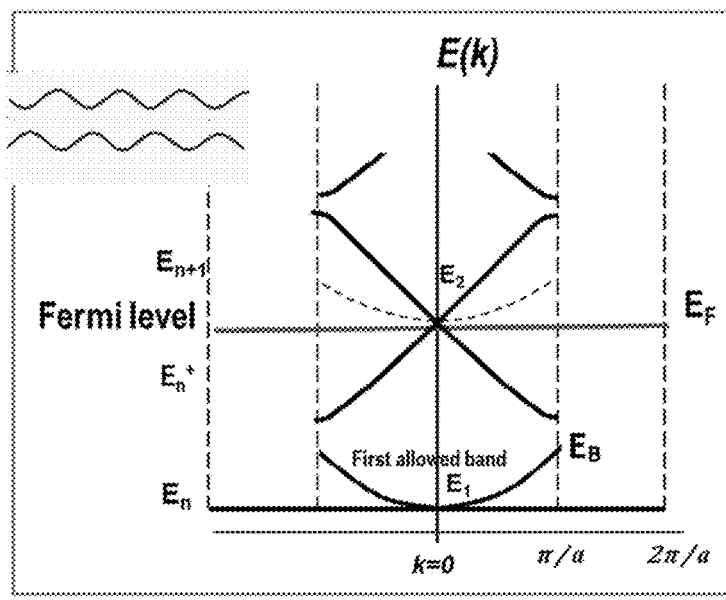
FIG. 15 shows the energy band diagram for Δx=a/2.

It is noted that the threshold energy $\Delta E_{th}$ is approximately equal to the energy between two subsequent resonant quantum states described, for example, in FIGS. 6 and 14. The energy is controlled by the width d of the channel and its period a, and can be made small enough, but at least three times greater than the thermal energy corresponding an ambient temperature at which the transistor operates. The small energy $\Delta E_{th}$ allows correspondingly for decreasing the channel length and the ballistic transport time and make them short enough to reliably reach a THz range of oscillations.

Therefore, such a BBFET oscillator can reach THz-range frequencies.

Validation of the BBFET Concept

Figures 19A, 19B, 19C:
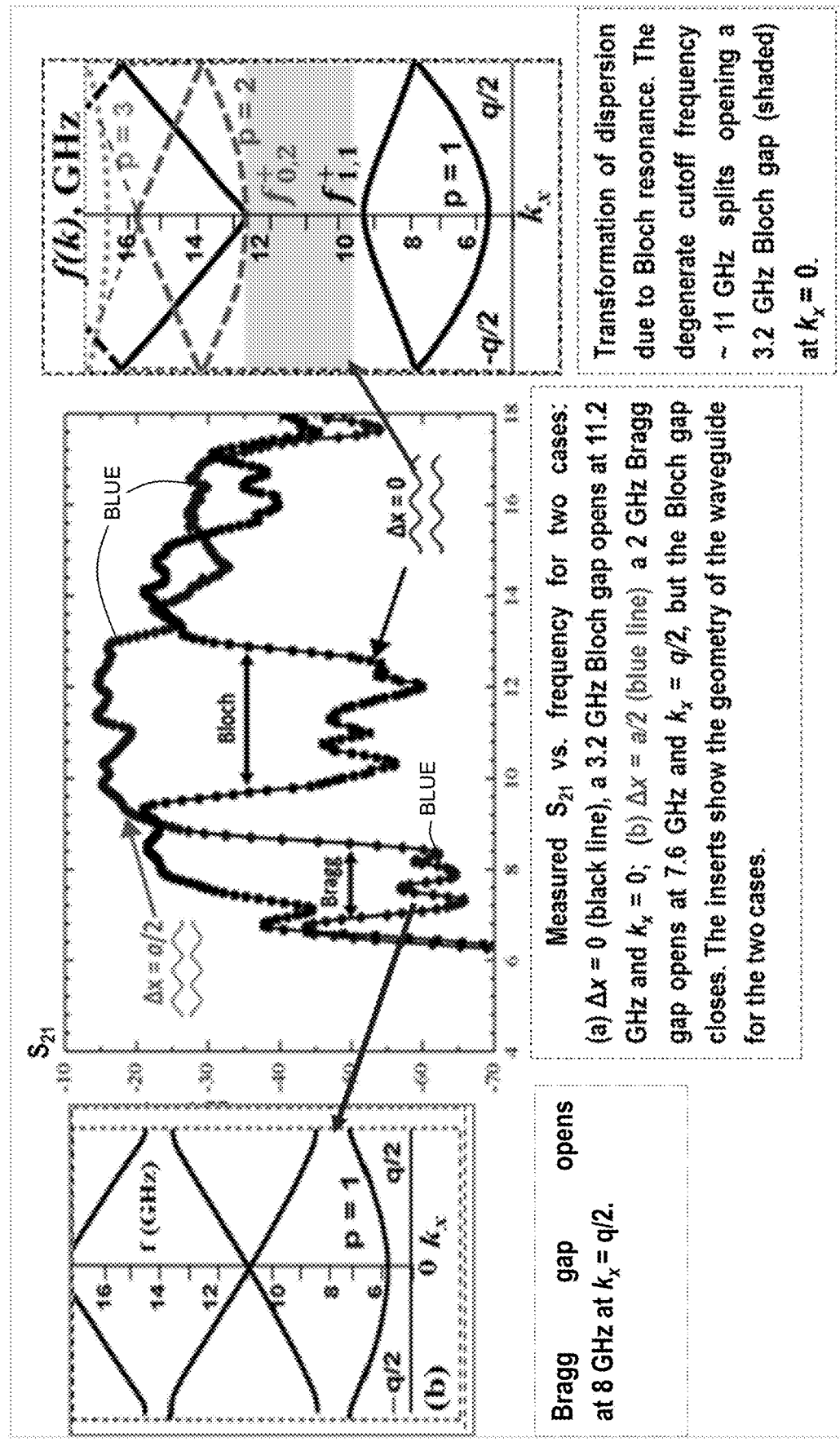
FIGS. 19A-19C illustrate the changes in a frequency diagram for a shift in lateral periodicity of ±a/2 (half period).

FIGS. 19A-19C illustrate the changes in a frequency diagram for a shift in lateral periodicity of ±a/2 (half period). FIG. 19A shows how a ~2 GHz Bragg gap opens at ~7.6 GHz at $k_x$=q/2, in a configuration where Δx=a/2. This is reflected in the blue line of FIG. 19B which shows measured $S_{21}$ vs. frequency. In a configuration where Δx=0, a ~3.2 GHz Bloch gap opens at ~11.2 GHz and $k_x$=q/2. FIG. 19C shows transformation of dispersion due to Bloch resonance. The degenerate cutoff frequency ~11 GHz splits, opening a ~3.2 GHz Bloch gap (shaded region of the figure) at $k_x$=0.

Advantages of Embodiments of the BBFET

1) BBFET is a ballistic transistor that by definition is a fast transistor for THz applications with a minimal power dissipation.

2) In a ballistic transistor, shrinking the size of the transistor improves its ballistic transport. In other words the smaller transistor, the better its operation.

3) In BBFET concentration of electrons in the channel remains constant upon switching transistor between ON/OFF states, while MOSFET operation is based on a sharp change in electron concentration that produces a delay. BBFET has not such delay on switching.

5) The simplicity of the transistor.

6) The BBFET may be made from as few as two materials: metal (aluminum, gold, etc.) for contacts and the gate, and a strip of a 2D-conduction layer.

7) The BBFET lateral gate with repelling electron potential does not require fabrication of a dielectric layer between the gate and channel in contrast to a MOSFET structure.

8) The simplicity described above significantly simplifies fabrication of the BBFET and therefore significantly reduces the price of a transistor, a chip, a computer, and of electronics in general. Now semiconductor companies spend 70%-80% of the total effort to produce transistor on fabrication the thin oxide film separating the gate and channel in MOSFET. The BBFET does not require the fabrication of such oxide layer.

Unique aspects of the presently-disclosed BBFET include:

1. The periodic shape of BBFET 2DEG channel configuration that meets Bloch resonance condition.

2. The mechanism of BBFET operation based on creating a gap in the electron energy spectrum of a 2D conducting layer by applying a voltage to the lateral periodically-shaped split-gate. The gap results in ON/OFF switching while the electron concentration in the channel remains almost constant.

3. The periodic shape of 2DEG channel producing OFF state: relation between d, a, $E_F$, the Bloch resonance condition, and E(Fermi)~E(gap)—the relations underlying the mechanism of the BBFET OFF state.

4. The mechanism underlying the BBFET Dirac state with the maximum small effective electron mass.

5. The mechanism underlying the BBFET two ON states with opposite directions of electron velocity upon varying the Fermi level±$\Delta E_F$ in vicinity of Dirac point.

6. The BBFET with an interdigitated upper arm of the split-gate for electronic switching of the shift the in lateral gate periodicity: Δx=0 and Δx=a/2.

7. The BBFET with two sets of split-gates with different shifts between the upper and lower channel boundary periodic profiles (Δx=0 and Δx=a/2) which produce two different field-effect electronic energy bandgaps (heterostructure) along the 2DEG channel with a uniform chemical composition.

8. The BBFET oscillator configuration, the underlying mechanism of its oscillation state and method of Bloch-FET oscillator operation.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:

1. A semiconductor device, comprising:
   a source;
   a drain spaced apart from the source;
   a channel electrically connected to the drain and the source, and having a length from the drain to the source which is less than or equal to an electron mean free path ($\ell$) of the channel;
   a first gate comprising two arms, each arm extending between the drain and the source and the arms disposed proximate to a first and second edge of the channel, respectively, and wherein each arm of the first gate has a periodic profile along the corresponding edge of the channel and the periodic profiles of each arm are offset from each other such that a distance between the arms is constant.

2. The semiconductor device of claim 1, wherein the profiles of the arms of the first gate have a period of distance a and the profile of an arm is offset from the profile of the other arm by a distance of a/2.

3. The semiconductor device of claim 1, wherein the channel comprises a two-dimensional electron gas ("2DEG").

4. The semiconductor device of claim 1, wherein the first gate is configured such that a negative bias voltage applied to the first gate will reduce an effective channel width, d.

5. The semiconductor device of claim 4, wherein a Bloch voltage, $V_{Bloch}$, applied to the first gate will reduce the effective channel width such that Bloch resonance conditions are met.

6. The semiconductor device of claim 1, wherein the first and second edges of the channel are straight and parallel to one another.

7. The semiconductor device of claim 1, wherein the first and second edges of the channel each have a periodic profile configured such that the channel generates Bloch resonance when no bias voltage is applied to the first gate.

8. The semiconductor device of claim 7, wherein the periodic profiles of the first and second edges corresponds to the periodic profiles of the arms of the first gate.

9. The semiconductor device of claim 1, wherein the periodic profiles of the arms of the first gate are sinusoidal, triangular, or rectangular.

10. The semiconductor device of claim 1, further comprising a second gate in series with the first gate along the length of the channel, the second gate comprising two arms disposed proximate to the first and second edges of the channel, respectively, and wherein each arm of the second gate has a periodic profile adjacent to the corresponding edge of the channel and the periodic profiles of each arm of the second gate are different from the periodic profiles of the arms of the first gate.

11. The semiconductor device of claim 10, wherein the periodic profiles of the arms of the second gate are not offset from each other such that the distance between the arms of the second gate varies in relation to the profiles.

12. The semiconductor device of claim 1, wherein the arms of the first gate include a second periodic profile interdigitated with the first periodic profile and the gate is configured for selective application of a bias voltage to the first periodic profile and/or the second periodic profile.

13. The semiconductor device of claim 12, wherein the profiles of the arms of the first gate have a period of distance a and the profile of an arm is offset from the profile of the other arm by a distance of a/2, and where the periodic profiles of each arm of the second gate are not offset from each other.

14. A method for operating a transistor, comprising:
providing a semiconductor device according to claim 1;
applying a negative bias voltage to the first gate so as to reduce the effective channel width such that Bloch resonance conditions are met to stop a flow of electrons between the drain and the source.

15. A method for operating a transistor, comprising:
providing a semiconductor device according to claim 1;
applying a negative bias voltage to the first gate such that a Fermi level, $E_F$, is substantially the same as the energy of a Dirac point, $E_{Dirac}$.

16. A method for operating a transistor, comprising:
providing a semiconductor device according to claim 1;
applying a negative bias voltage to the first gate such that a Fermi level, $E_F$, is within 75 meV of the energy of a Dirac point, $E_{Dirac}$.

17. A method for operating a transistor, comprising:
providing a semiconductor device according to claim 7;
applying a negative bias voltage to the first gate so as to increase the effective channel width and allow a flow of electrons between the drain and the source.

18. An oscillator, comprising a semiconductor device of claim 10.

* * * * *